(12) United States Patent
Raring et al.

(10) Patent No.: US 8,524,578 B1
(45) Date of Patent: *Sep. 3, 2013

(54) METHOD AND SURFACE MORPHOLOGY OF NON-POLAR GALLIUM NITRIDE CONTAINING SUBSTRATES

(75) Inventors: James W. Raring, Fremont, CA (US); Christiane Poblenz, Fremont, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/548,770

(22) Filed: Jul. 13, 2012

Related U.S. Application Data

(62) Division of application No. 12/497,289, filed on Jul. 2, 2009, now Pat. No. 8,247,887.

(60) Provisional application No. 61/182,107, filed on May 29, 2009.

(51) Int. Cl.
*H01L 21/02* (2006.01)

(52) U.S. Cl.
USPC .......................................................... 438/479

(58) Field of Classification Search
USPC ...................... 257/628, 94; 438/478, 46, 479, 438/958; 372/45.01; 117/101–103
See application file for complete search history.

(56) References Cited

U.S. PATENT DOCUMENTS

| | | | |
|---|---|---|---|
| 4,911,102 A | 3/1990 | Manabe et al. | |
| 5,331,654 A | 7/1994 | Jewell et al. | |
| 5,647,945 A | 7/1997 | Matsuse et al. | |
| 5,951,923 A | 9/1999 | Horie et al. | |
| 6,072,197 A | 6/2000 | Horino et al. | |
| 6,195,381 B1 | 2/2001 | Botez et al. | |
| 6,635,904 B2 | 10/2003 | Goetz et al. | |
| 6,639,925 B2 | 10/2003 | Niwa et al. | |
| 6,809,781 B2 | 10/2004 | Setlur et al. | |
| 6,858,882 B2 | 2/2005 | Tsuda et al. | |
| 7,009,199 B2 | 3/2006 | Hall | |
| 7,019,325 B2 | 3/2006 | Li et al. | |
| 7,033,858 B2 | 4/2006 | Chai et al. | |

(Continued)

FOREIGN PATENT DOCUMENTS

| | | |
|---|---|---|
| CN | 101009347 | 3/1987 |
| CN | 1538534 | 10/2004 |

(Continued)

OTHER PUBLICATIONS

Chinese Office Action From Chinese Patent Application No. 200980134723.8 dated Nov. 1, 2012, 22 pgs. (With Translation).

(Continued)

*Primary Examiner* — Nathan Ha
(74) *Attorney, Agent, or Firm* — Kilpatrick Townsend & Stockton LLP

(57) ABSTRACT

An optical device, e.g., LED, laser. The device includes a non-polar gallium nitride substrate member having a slightly off-axis non-polar oriented crystalline surface plane. In a specific embodiment, the slightly off-axis non-polar oriented crystalline surface plane is up to about −0.6 degrees in a c-plane direction, but can be others. In a specific embodiment, the present invention provides a gallium nitride containing epitaxial layer formed overlying the slightly off-axis non-polar oriented crystalline surface plane. In a specific embodiment, the device includes a surface region overlying the gallium nitride epitaxial layer that is substantially free of hillocks.

17 Claims, 6 Drawing Sheets

(56) References Cited

U.S. PATENT DOCUMENTS

| | | | |
|---|---|---|---|
| 7,128,849 B2 | 10/2006 | Setlur et al. |
| 7,358,542 B2 | 4/2008 | Radkov et al. |
| 7,358,543 B2 | 4/2008 | Chua et al. |
| 7,483,466 B2 | 1/2009 | Uchida et al. |
| 7,491,984 B2 | 2/2009 | Koike et al. |
| 7,598,104 B2 | 10/2009 | Teng et al. |
| 7,691,658 B2 | 4/2010 | Kaeding et al. |
| 7,709,284 B2 | 5/2010 | Iza et al. |
| 7,733,571 B1 | 6/2010 | Li |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 8,044,412 B2 | 10/2011 | Murphy et al. |
| 8,124,996 B2 | 2/2012 | Raring et al. |
| 8,126,024 B1 | 2/2012 | Raring |
| 8,143,148 B1 | 3/2012 | Raring et al. |
| 8,242,522 B1 | 8/2012 | Raring |
| 8,254,425 B1 | 8/2012 | Raring |
| 8,259,769 B1 | 9/2012 | Raring et al. |
| 8,284,810 B1 | 10/2012 | Sharma et al. |
| 8,294,179 B1 | 10/2012 | Raring |
| 8,314,429 B1 | 11/2012 | Raring et al. |
| 8,351,478 B2 | 1/2013 | Raring et al. |
| 8,355,418 B2 | 1/2013 | Raring et al. |
| 2001/0048114 A1 | 12/2001 | Morita et al. |
| 2002/0027933 A1 | 3/2002 | Tanabe et al. |
| 2002/0105986 A1 | 8/2002 | Yamasaki |
| 2002/0171092 A1 | 11/2002 | Goetz et al. |
| 2003/0178617 A1 | 9/2003 | Appenzeller et al. |
| 2003/0200931 A1 | 10/2003 | Goodwin |
| 2004/0099213 A1 | 5/2004 | Adomaitis et al. |
| 2004/0146264 A1 | 7/2004 | Auner et al. |
| 2004/0233950 A1 | 11/2004 | Furukawa et al. |
| 2004/0247275 A1 | 12/2004 | Vakhshoori et al. |
| 2005/0214992 A1 | 9/2005 | Chakraborty et al. |
| 2005/0218413 A1 | 10/2005 | Matsumoto et al. |
| 2005/0230701 A1 | 10/2005 | Huang |
| 2005/0247260 A1 | 11/2005 | Shin et al. |
| 2005/0285128 A1 | 12/2005 | Scherer et al. |
| 2006/0033009 A1 | 2/2006 | Kobayashi et al. |
| 2006/0077795 A1 | 4/2006 | Kitahara et al. |
| 2006/0126688 A1 | 6/2006 | Kneissl |
| 2006/0175624 A1 | 8/2006 | Sharma et al. |
| 2006/0213429 A1 | 9/2006 | Motoki et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0101932 A1 | 5/2007 | Schowalter et al. |
| 2007/0120141 A1 | 5/2007 | Moustakas et al. |
| 2007/0153866 A1 | 7/2007 | Shchegrov et al. |
| 2007/0163490 A1 | 7/2007 | Habel et al. |
| 2007/0184637 A1 | 8/2007 | Haskell et al. |
| 2007/0242716 A1 | 10/2007 | Samal et al. |
| 2007/0259464 A1 | 11/2007 | Bour et al. |
| 2007/0272933 A1 | 11/2007 | Kim et al. |
| 2007/0280320 A1 | 12/2007 | Feezell et al. |
| 2008/0121916 A1 | 5/2008 | Teng et al. |
| 2008/0149949 A1 | 6/2008 | Nakamura et al. |
| 2008/0149959 A1 | 6/2008 | Nakamura et al. |
| 2008/0198881 A1 | 8/2008 | Farrell et al. |
| 2008/0251020 A1 | 10/2008 | Franken et al. |
| 2008/0283851 A1* | 11/2008 | Akita .............................. 257/94 |
| 2008/0298409 A1 | 12/2008 | Yamashita et al. |
| 2008/0308815 A1 | 12/2008 | Kasai et al. |
| 2009/0021723 A1 | 1/2009 | De Lega |
| 2009/0066241 A1 | 3/2009 | Yokoyama |
| 2009/0080857 A1 | 3/2009 | St. John-Larkin |
| 2009/0153752 A1 | 6/2009 | Silverstein |
| 2009/0273005 A1 | 11/2009 | Lin |
| 2009/0316116 A1 | 12/2009 | Melville et al. |
| 2009/0321778 A1 | 12/2009 | Chen et al. |
| 2010/0006546 A1 | 1/2010 | Young et al. |
| 2010/0044718 A1 | 2/2010 | Hanser et al. |
| 2010/0104495 A1 | 4/2010 | Kawabata et al. |
| 2010/0195687 A1 | 8/2010 | Okamoto et al. |
| 2010/0220262 A1 | 9/2010 | DeMille et al. |
| 2010/0276663 A1 | 11/2010 | Enya et al. |
| 2010/0309943 A1 | 12/2010 | Chakraborty et al. |
| 2010/0327291 A1 | 12/2010 | Preble et al. |
| 2011/0031508 A1 | 2/2011 | Hamaguchi et al. |
| 2011/0075694 A1 | 3/2011 | Yoshizumi et al. |
| 2011/0129669 A1 | 6/2011 | Fujito et al. |
| 2011/0164637 A1 | 7/2011 | Yoshizumi et al. |
| 2011/0182056 A1 | 7/2011 | Trottier et al. |
| 2011/0188530 A1 | 8/2011 | Lell et al. |
| 2011/0216795 A1 | 9/2011 | Hsu et al. |
| 2011/0281422 A1 | 11/2011 | Wang et al. |
| 2011/0286484 A1 | 11/2011 | Raring et al. |
| 2012/0104359 A1 | 5/2012 | Felker et al. |
| 2012/0178198 A1 | 7/2012 | Raring et al. |
| 2012/0187371 A1 | 7/2012 | Raring et al. |
| 2012/0314398 A1 | 12/2012 | Raring et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |

FOREIGN PATENT DOCUMENTS

| | | |
|---|---|---|
| CN | 1702836 | 11/2005 |
| CN | 101079463 | 11/2007 |
| CN | 101099245 | 1/2008 |
| CN | 101171692 | 4/2008 |
| JP | 3-287770 | 12/1991 |
| WO | 2008/041521 | 4/2008 |

OTHER PUBLICATIONS

Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.

Franssila, 'Tools for CVD and Epitaxy', Introduction to Microfabrication, 2004, pp. 329-336.

USPTO Office Action for U.S. Appl. No. 12/481,543 dated Jun. 27, 2011.

USPTO Office Action for U.S. Appl. No. 12/482,440 dated Feb. 23, 2011.

USPTO Office Action for U.S. Appl. No. 12/482,440 dated Aug. 12, 2011.

USPTO Office Action for U.S. Appl. No. 12/484,924 dated Apr. 14, 2011.

USPTO Office Action for U.S. Appl. No. 12/491,169 dated Oct. 22, 2010.

USPTO Office Action for U.S. Appl. No. 12/491,169 dated May 11, 2011.

USPTO Office Action for U.S. Appl. No. 12/502,058 dated Dec. 8, 2010.

USPTO Office Action for U.S. Appl. No. 12/502,058 dated Aug. 19, 2011.

USPTO Notice of Allowance for U.S. Appl. No. 12/502,058 dated Apr. 16, 2012.

USPTO Notice of Allowance for U.S. Appl. No. 12/502,058 dated Jul. 19, 2012.

USPTO Office Action for U.S. Appl. No. 12/534,829 dated Apr. 19, 2011.

USPTO Notice of Allowance for U.S. Appl. No. 12/534,829 dated Oct. 28, 2011.

USPTO Notice of Allowance for U.S. Appl. No. 12/534,829 dated Dec. 5, 2011.

USPTO Notice of Allowance for U.S. Appl. No. 12/534,829 dated Dec. 21, 2011.

USPTO Office Action for U.S. Appl. No. 12/573,820 dated Mar. 2, 2011.

USPTO Office Action for U.S. Appl. No. 12/749,466 dated Jun. 29, 2011.

USPTO Office Action for U.S. Appl. No. 12/749,466 dated Jul. 3, 2012.

USPTO Office Action for U.S. Appl. No. 12/759,273 dated Jun. 26, 2012.

USPTO Notice of Allowance for U.S. Appl. No. 12/762,269 dated Apr. 23, 2012.
USPTO Office Action for U.S. Appl. No. 12/762,271 dated Jun. 6, 2012.
USPTO Notice of Allowance for U.S. Appl. No. 12/762,271 dated Aug. 8, 2012.
USPTO Notice of Allowance for U.S. Appl. No. 12/778,718 dated Apr. 3, 2012.
USPTO Notice of Allowance for U.S. Appl. No. 12/778,718 dated Jun. 13, 2012.
USPTO Office Action for U.S. Appl. No. 12/789,303 dated Sep. 24, 2012.
USPTO Office Action for U.S. Appl. No. 12/859,153 dated Sep. 25, 2012.
USPTO Office Action for U.S. Appl. No. 12/868,441 dated Apr. 30, 2012.
USPTO Office Action for U.S. Appl. No. 12/880,803 dated Feb. 22, 2012.
USPTO Notice of Allowance for U.S. Appl. No. 12/880,803 dated Jul. 18, 2012.
USPTO Office Action for U.S. Appl. No. 12/883,093 dated Mar. 13, 2012.
USPTO Office Action for U.S. Appl. No. 12/883,093 dated Aug. 3, 2012.
USPTO Notice of Allowance for U.S. Appl. No. 12/883,093 dated Nov. 21, 2012.
USPTO Office Action for U.S. Appl. No. 12/883,652 dated Apr. 17, 2012.
USPTO Office Action for U.S. Appl. No. 12/884,993 dated Mar. 16, 2012.
USPTO Office Action for U.S. Appl. No. 12/884,993 dated Aug. 2, 2012.
USPTO Notice of Allowance for U.S. Appl. No. 12/884,993 dated Nov. 26, 2012.
USPTO Office Action for U.S. Appl. No. 12/995,946 dated Mar. 28, 2012.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/046,565 dated Apr. 13, 2012.
USPTO Office Action for U.S. Appl. No. 13/046,565 dated Jul. 19, 2012.
USPTO Office Action for U.S. Appl. No. 13/354,639 dated Nov. 7, 2012.
USPTO Notice of Allowance for U.S. Appl. No. 13/354,639 dated Dec. 14, 2012.
International Preliminary Report & Written Opinion of PCT Application No. PCT/US2011/037792, dated Sep. 8, 2011, 13 pages total.
Tyagi et al., 'Semipolar (1011) InGaN/GaN Laser Diodes on Bulk GaN Substrates,' Japanese Journal of Applied Physics, vol. 46, No. 19, 2007, pp. L444-L445.
USPTO Office Action for U.S. Appl. No. 12/995,946 dated Jan. 29, 2013.
USPTO Office Action for U.S. Appl. No. 12/534,838 dated May 3, 2011.
USPTO Office Action for U.S. Appl. No. 12/534,838 dated Jan. 13, 2012.
USPTO Office Action for U.S. Appl. No. 12/534,838 dated Mar. 20, 2012.
USPTO Notice of Allowance for U.S. Appl. No. 12/534,838 dated Jun. 8, 2012.
USPTO Office Action for U.S. Appl. No. 12/859,153 dated Feb. 26, 2013.
USPTO Office Action for U.S. Appl. No. 12/942,817 dated Feb. 20, 2013.
USPTO Notice of Allowance for U.S. Appl. No. 13/108,645 dated Jan. 28, 2013.
USPTO Office Action for U.S. Appl. No. 13/291,922 dated Feb. 20, 2013.
USPTO Office Action for U.S. Appl. No. 13/425,354 dated Feb. 14, 2013.
USPTO Office Action for U.S. Appl. No. 13/606,894 dated Feb. 5, 2013.

* cited by examiner

METHOD AND SURFACE MORPHOLOGY OF NON-POLAR GALLIUM NITRIDE CONTAINING SUBSTRATES

CROSS-REFERENCES TO RELATED APPLICATIONS

This application is a divisional application of U.S. application Ser. No. 12/497,289 filed on Jul. 2, 2009 now U.S. Pat. No. 8,247,887, which claims priority to U.S. Provisional Patent Application No. 61/182,107 filed on May 29, 2009, entitled "METHOD AND SURFACE MORPHOLOGY OF NON-POLAR GALLIUM NITRIDE CONTAINING SUBSTRATES" by inventors JAMES W. RARING and CHRISTIANE POBLENZ, commonly assigned and incorporated by reference herein for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to optical devices and related methods. More particularly, the present invention provides a method and device for fabricating crystalline films for emitting electromagnetic radiation using non-polar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In the late 1800's, Thomas Edison invented the conventional light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional Edison light bulb.

First, the conventional light bulb dissipates much thermal energy. More than 90% of the energy used for the conventional light bulb dissipates as thermal energy.

Secondly, reliability is an issue since the conventional light bulb routinely fails often due to thermal expansion and contraction of the filament element.

Thirdly, light bulbs emit light over a broad spectrum, much of which does not result in bright illumination due to the spectral sensitivity of the human eye.

Lastly, light bulbs emit in all directions and are not ideal for applications requiring strong directionality or focus such as projection displays, optical data storage, or specialized directed lighting.

In 1960, Theodore H. Maiman demonstrated the first laser at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulateable, they suffer from severe sensitivity to temperature which limits their application. These and other limitations may be described throughout the present specification and more particularly below.

From the above, it is seen that techniques for improving optical devices is highly desired.

BRIEF SUMMARY OF THE INVENTION

According to the present invention, techniques related generally to optical devices are provided. More particularly, the present invention provides a method and device for fabricating crystalline films for emitting electromagnetic radiation using non-polar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices. In a preferred embodiment, the optical device is a laser that has been configured for blue and green emissions, as well as others. In still a preferred embodiment, the optical device is an LED that has been configured for blue emission, as well as others.

In a specific embodiment, the present invention provides a method and resulting nonpolar m-plane (10-10) oriented gallium nitride structure (e.g., gallium and nitrogen containing structure, gallium nitride structure) having smooth surface morphology, which is often substantially free from hillocks and the like. In one or more embodiments, the method includes using a miscut or offcut surface or no miscut or offcut or other off-axis orientation of a non-polar m-plane surface orientation as a growth surface region. In a preferred embodiment, the epitaxial layer is configured using at least an atmospheric pressure (e.g. 700-800 Torr) epitaxial formation process, but may also be configured for other processes. In a specific embodiment, the method includes use of a $N_2$ carrier and subflow gas, which is substantially all $N_2$, as a medium for precursor gases, which form the crystalline gallium nitride epitaxial material (e.g., gallium and nitrogen containing epitaxial material). The growth using the substantially predominant $N_2$ gas leads to formation of crystalline gallium nitride epitaxial material substantially free of hillocks and the like. Of course, there can be other variations, modifications, and alternatives. As used herein, the term "nonpolar (10-10) oriented gallium nitride structure" refers to the family of non-polar m-plane (10-10) oriented gallium nitride structures, nonpolar m-plane (10-10) oriented gallium and nitrogen containing structures, and the like.

In an alternative preferred embodiment, the present invention includes use of a gallium nitride substrate configured in a non-polar (10-10) surface orientation that has a miscut towards the c-plane (0001) ranging from about −0.6 degrees to about −2.0 degrees and any miscut towards the a-plane (11-20) although there can be other orientations and degrees of miscut or offcut or off-axis orientation. In one or more embodiments, the method uses an $H_2$ carrier gas and combination of $H_2$ and $N_2$ subflow gases in further combination with precursor gases for growth of crystalline gallium nitride epitaxial material. In still a preferred embodiment, the miscut can be about −0.8 degrees to about −1.1 degrees toward the c-plane (0001) and between −0.3 degrees and 0.3 degrees towards the a-plane (11-20) to cause formation of an overlying gallium nitride epitaxial layer with smooth morphology. Of course, there can be other variations, modifications, and alternatives.

Still further, the present invention provides an optical device that has epitaxial film that is substantially free from morphological features on the surface such as hillocks and the like. In a specific embodiment the device has a non-polar (10-10) gallium nitride substrate member having a slightly off-axis non-polar oriented crystalline surface plane. In one or more embodiments, the slightly off-axis (or on-axis) non-polar oriented crystalline surface plane ranges from about 0 degrees to a predetermined degree toward either or both the c-plane and/or a-plane. In a specific embodiment, the device has a gallium nitride containing epitaxial layer formed overlying the slightly off-axis non-polar oriented crystalline surface plane. A surface region is overlying the gallium nitride epitaxial layer. In a preferred embodiment, the surface region being substantially free from hillocks having an average spatial dimension of, for example, 10-100 microns and greater, but can be other dimensions. In a preferred embodiment, the epitaxial layer is configured using at least an atmospheric pressure (e.g. 700-800 Torr) epitaxial formation process. In a specific embodiment, the epitaxial layer comprises one or more layers which form at least a quantum well of at least 3.5 nanometers and greater or other desirable dimensions. The quantum well, which is thicker, leads to improved laser devices.

Still further, the present invention provides a method of fabricating an optical device. The method includes providing a non-polar (10-10) gallium nitride substrate member having a slightly off-axis non-polar oriented crystalline surface plane. In a specific embodiment, the slightly off-axis non-polar oriented crystalline surface plane is greater in magnitude than about negative 0.6 degrees toward the c-plane (0001) or other desirable magnitudes. The method includes forming a gallium nitride containing epitaxial layer having a smooth surface region substantially free of hillocks overlying the slightly off-axis non-polar oriented crystalline surface plane.

In yet other embodiments, the present invention provides a method of fabricating an alternative optical device. The method includes providing a non-polar (10-10) gallium nitride substrate member having a slightly off-axis non-polar oriented crystalline surface plane in a specific embodiment. The slightly off-axis non-polar oriented crystalline surface plane ranges from about 0 degrees to a predetermined degree toward either or both the c-plane or a-plane. In a specific embodiment, the present method includes forming a gallium nitride containing epitaxial layer, using at least an atmospheric pressure (e.g. 700-800 Torr) epitaxial process to form at least a quantum well having a thickness of at least 3.5 nanometers and greater or other desirable dimensions. Preferably, the gallium nitride epitaxial layer has a surface region substantially smooth and free from hillocks.

As used herein, the term "miscut" should be interpreted according to ordinary meaning understood by one of ordinary skill in the art and does not imply a specific process to achieve the orientation. The term miscut is not intended to imply any undesirable cut relative to, for example, any of the crystal planes, e.g., c-plane, a-plane. The term miscut is intended to describe a surface orientation slightly tilted with respect to the primary surface crystal plane such as the nonpolar (10-10) GaN plane. Additionally, the term "offcut" or "off-axis" is intended to have a similar meaning as miscut that does not imply any process to achieve the orientation, although there could be other variations, modifications, and alternatives. In yet other embodiments, the crystalline surface plane is not miscut and/or offcut and/or off-axis but can be configured using a mechanical and/or chemical and/or physical process to expose any one of the crystalline surfaces described explicitly and/or implicitly herein. In specific embodiments, the terms miscut and/or offcut and/or off-axis are characterized by at least one or more directions and corresponding magnitudes, although there can be other variations, modifications, and alternatives.

Benefits are achieved over pre-existing techniques using the present invention. In particular, the present invention enables a cost-effective technique for growth of large area crystals of non-polar materials, including GaN, AN, InN, InGaN, and AlInGaN and others and other gallium and nitrogen containing materials. In a specific embodiment, the present method and resulting structure are relatively simple and cost effective to manufacture for commercial applications. A specific embodiment also takes advantage of a combination of techniques, which solve a long standing need. In a preferred embodiment, the (10-10) non-polar substrate and overlying epitaxial crystalline gallium nitride containing film are smooth and substantially free from hillocks and the like, which improve device performance. As used herein, the term "smooth" generally means substantially free from hillocks or other surface imperfections, which lead to degradation in device performance, including reliability, intensity, efficiency, and other parameters that generally define performance. Of course, the term smooth would also include other interpretations known by one of ordinary skill in the art, as well as variations, modifications, and alternatives. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

According to the present invention, techniques related generally to optical devices are provided. More particularly, the present invention provides a method and device for fabricating crystalline films for emitting electromagnetic radiation using non-polar (10-10) gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In one or more embodiments, the present invention is directed to generate high efficiency GaN-based light emitting devices operating at wavelengths beyond 400 nm for blue, green, yellow and red emission according to embodiments of the present invention. The proposed device will be used as an optical source for various commercial, industrial, or scientific applications. These structures are expected to find utility in existing applications where blue-violet, blue, green, yellow and red laser/LED emission is required. An existing application includes HD-DVD and Sony Blu-Ray™ players. One particularly promising application for these devices is full color displays requiring red-green-blue or blue-yellow color mixing. Another potential application is for optical communication through polymer based fibers where increased wavelengths will result in reduced loss.

In a specific embodiment, the present invention provides a GaN-based semiconductor laser/LED growth/fabrication method to achieve increased wavelength operation into the blue, green, yellow and red regime on nonpolar GaN substrates where superior laser/LED performance can be expected according to a specific embodiment. The device relies on smooth surface region films of epitaxial crystalline GaN containing materials for improved device performance. The smooth surface region and therefore higher quality crystalline material can be derived from epitaxial growth techniques according to one or more embodiments.

Epitaxial growth on the nonpolar (10-10) plane of bulk GaN has been emerging and possesses various limitations. Understanding growth parameter space for optimal epitaxial layer deposition is often important for the realization of high performance electronic on optoelectronic devices fabricated from the epitaxial layers. At least one key aspect of the film quality is the morphology. Morphology manifests itself in large scale features that are on the order of 10s to 100s of microns all the way down to the atomic scale on the order of Angstroms. Achieving smooth epitaxial layers on both the large scale and small scale often translate into high performance devices.

Figure 1C:
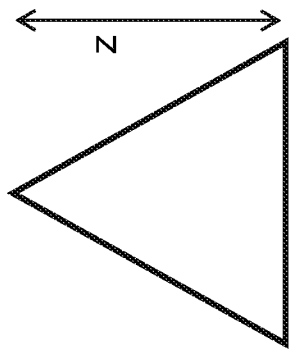
FIG. 1(c) is a schematic illustration of a cross-sectional view of a hillock structure.
Figure 1B:
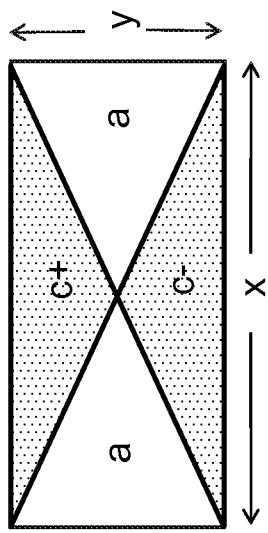
FIG. 1(b) is a schematic illustration of a top down view of a hillock structure.
Figure 1A:
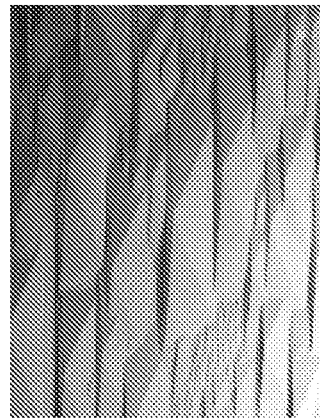
FIG. 1(a) is an optical micrograph image representative of a conventional surface region including hillock structures on a non-polar GaN substrate.

FIG. 1(a) is an optical micrograph image which represents a conventional surface region of a non-polar (10-10) oriented gallium nitride epitaxial layer, including hillock structures. The surface shown is representative of epitaxial deposition at atmospheric pressure conditions (e.g. 700-800 Torr) on a non-polar (10-10) GaN substrate. As shown, non-polar GaN can exhibit very distinct large-scale features referred to herein as hillocks. FIG. 1(b) and FIG. 1(c) are schematic illustrations of a top-down and cross-sectional view of such a hillock feature. As shown, these hillocks are pyramidal in shape and typically elongated in the in the positive and negative a-directions and can demonstrate significantly steep sidewalls in the positive and negative c-directions. Schematic illustration of a top-down view of a pyramidal hillock structure is provided in FIG. 1(b). As shown, shaded regions represent faces of such a hillock structure which are inclined toward the c+ and c− directions and white regions labeled "a" represent faces of such a hillock structure which are symmetrically inclined toward the a+/a− direction. Such hillocks are typically elongated in the +/−a direction such that the lateral dimension x is larger than the corresponding perpendicular width dimension y as shown. Lateral dimensions of such hillocks can range from 50-100 microns or greater. The hillocks can have a height scale on the orders of hundreds of nanometers, therefore they can be disruptive/detrimental to optoelectronic devices such as laser diodes since the cladding layers will have varying thickness along the cavity and the gain layers between the cladding layers can have sharp interfaces. As shown, the large-scale morphological features are predominantly "pyramidal hillocks" or like structures. These characteristics can lead to increased loss in optical devices such as lasers, reduced gain, and perhaps reduced yield and reliability. Of course, there can also be other limitations.

A method according to one or more embodiments for forming a smooth epitaxial film using an offcut or miscut or off-axis substrate is briefly outlined below.

1. Provide GaN substrate or boule;
2. Perform off-axis miscut of GaN substrate on nonpolar crystalline planes to expose desired surface region or process substrate or boule (e.g., mechanical process) to expose off-axis oriented surface region from the nonpolar (10-10) plane;
3. Transfer GaN substrate into MOCVD process chamber;
4. Provide a carrier gas selected from nitrogen gas, hydrogen gas, or a mixture of them;
5. Provide a nitrogen bearing species such as ammonia or the like;
4. Raise MOCVD process chamber to growth temperature, e.g., 700 to 1200 Degrees Celsius;
5. Maintain the growth temperature within a predetermined range;
6. Combine the carrier gas and nitrogen bearing species such as ammonia with group III precursors such as the indium precursor species tri-methyl-indium and/or tri-ethyl-indium, the gallium precursor species tri-methyl-gallium and/or tri-ethyl-gallium, and/or the aluminum precursor tri-methyl-aluminum into the chamber;
7. Form an epitaxial film containing one or more of the following layers GaN, InGaN, AlGaN, InAlGaN;
8. Cause formation of a surface region of the epitaxial gallium nitride film substantially free from hillocks and other surface roughness structures and/or features;
9. Repeat steps (7) and (8) for other epitaxial films to form one or more device structures; and
10. Perform other steps, desired.

The above sequence of steps provides a method according to an embodiment of the present invention. In a specific embodiment, the present invention provides a method and resulting crystalline epitaxial material with a surface region that is substantially smooth and free from hillocks and the like for improved device performance. Although the above has been described in terms of an off-axis surface configuration, there can be other embodiments having an on-axis configuration using one or more selected process recipes, which have been described in more detail throughout the present specification and more particularly below. Other alternatives can also be provided where steps are added, one or more steps are removed, or one or more steps are provided in a different sequence without departing from the scope of the claims herein.

As merely an example, the present method can use the following sequence of steps in forming one or more of the epitaxial growth regions using an MOCVD tool operable at atmospheric pressure or low pressure in some embodiments.
1. Start;
2. Provide a crystalline substrate member comprising a backside region and a surface region, which has been offcut or miscut or off-axis;
3. Load substrate member into an MOCVD chamber;
4. Place substrate member on susceptor, which is provided in the chamber, to expose the offcut or miscut or off axis surface region of the substrate member;
5. Subject the surface region to a first flow (e.g., derived from one or more precursor gases including at least an ammonia containing species, a Group III species, and a first carrier gas) in a first direction substantially parallel to the surface region;
6. Form a first boundary layer within a vicinity of the surface region;
7. Provide a second flow (e.g., derived from at least a second carrier gas) in a second direction configured to cause change in the first boundary layer to a second boundary layer;
8. Increase a growth rate of crystalline material formed overlying the surface region of the crystalline substrate member;
9. Continue crystalline material growth to be substantially free from hillocks and/or other imperfections;
10. Cease flow of precursor gases to stop crystalline growth;
11. Perform other steps and repetition of the above, as desired;
12. Stop.

The above sequence of steps provides methods according to an embodiment of the present invention. As shown, the method uses a combination of steps including a way of forming a film of crystalline material using MOCVD. In preferred embodiments, the present invention includes a multiflow technique provided at atmospheric pressure (e.g. 700-800 Torr) for formation of high quality gallium nitride containing crystalline films that are substantially free from hillocks and other imperfections that lead to crystal degradation. Many other methods, devices, and systems are also included. Of course, other alternatives can also be provided where steps are added, one or more steps are removed, or one or more steps are provided in a different sequence without departing from the scope of the claims herein. Additionally, the various methods can be implemented using a computer code or codes in software, firmware, hardware, or any combination of these. In other embodiments, the present MOCVD tool can be modified, updated, varied, or combined with other hardware, processing, and software. Depending upon the embodiment, there can be other variations, modifications, and alternatives. Further details of the present method can be found throughout the present specification and more particularly below in reference to the Figures.

Figure 2:
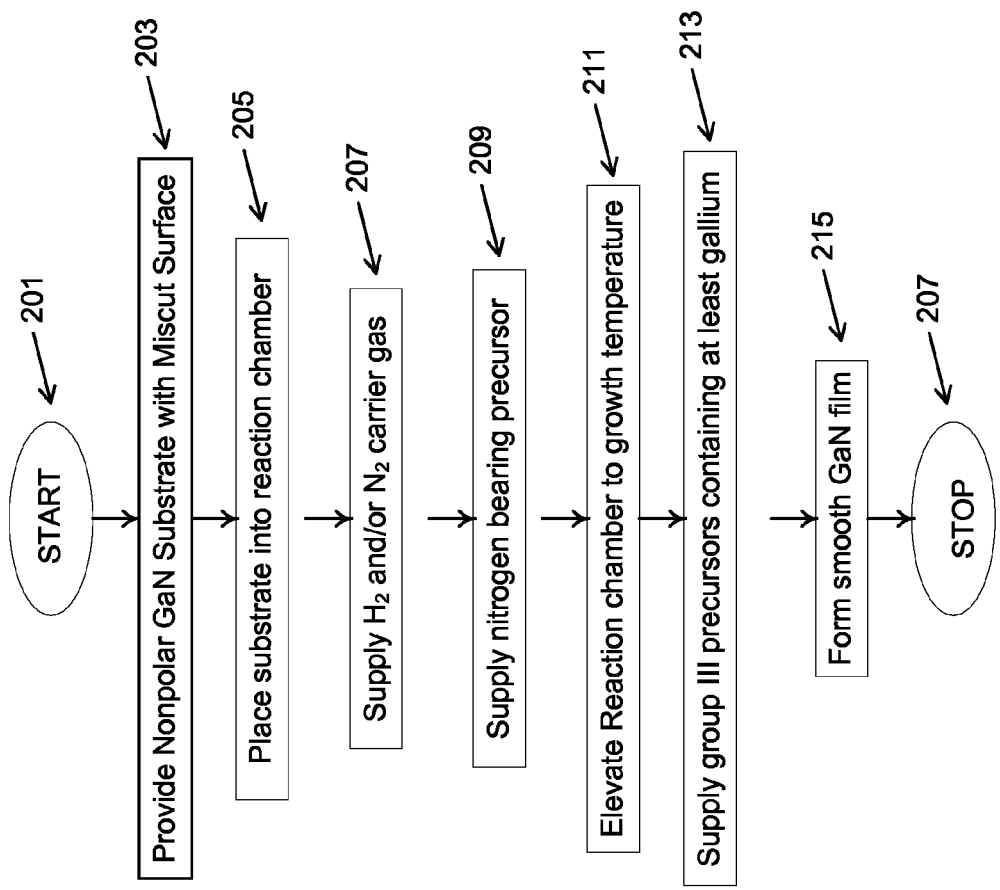
FIG. 2 is a simplified flow diagram of a method for fabricating an improved GaN film according to an embodiment of the present invention.

FIG. 2 is a simplified flow diagram of a method for fabricating an improved GaN film according to an embodiment of the present invention. This diagram is merely an example, which should not unduly limit the scope of the claims herein. One of ordinary skill in the art would recognize other variations, modifications, and alternatives. In a specific embodiment, the present method uses a technique using MOCVD as described in, for example, U.S. Provisional Application No. 61/103,238 filed Oct. 6, 2008, titled "METHOD AND SYSTEM FOR THIN FILM PROCESSING USING SHOWER HEAD DEVICE", which is hereby incorporated by reference herein.

As shown, the present method begins with start, step 201. In a specific embodiment, the present method uses a MOCVD reactor configured to carry out the present method. Details of the reactor are provided more particularly in U.S. Provisional Application No. 61/103,238 filed Oct. 6, 2008, titled "METHOD AND SYSTEM FOR THIN FILM PROCESSING USING SHOWER HEAD DEVICE", which is hereby incorporated by reference herein.

In a specific embodiment, the present invention provides (step 203) a crystalline substrate member comprising a backside region and a surface region. In a specific embodiment, the crystalline substrate member can include, among others, a gallium nitride wafer, or the like. In a preferred embodiment, the substrate is bulk nonpolar (10-10) GaN substrate, but can be other materials. More preferably, the substrate is a nonpolar (10-10) GaN substrate, but can be others.

In a specific embodiment, the present method uses a miscut or offcut crystalline substrate member or boule of GaN, but can be other materials and does not imply use of a process of achieving the miscut or offcut. As used herein, the term "miscut" should be interpreted according to ordinary meaning as understood by one of ordinary skill in the art. The term miscut is not intended to imply any undesirable cut relative to, for example, any of the crystal planes, e.g., c-plane, a-plane. The term miscut is intended to describe a surface orientation slightly tilted with respect to the primary surface crystal plane such as the nonpolar (10-10) GaN plane. Additionally, the term "offcut" is intended to have a similar meaning as miscut, although there could be other variations, modifications, and alternatives. In yet other embodiments, the crystalline surface plane is not miscut and/or offcut but can be configured using a mechanical and/or chemical and/or physical process to expose any one of the crystalline surfaces described explicitly and/or implicitly herein. In specific embodiments, the term miscut and/or offcut and/or off axis is characterized by at least one or more directions and corresponding magnitudes, although there can be other variations, modifications, and alternatives.

As shown, the method includes placing or loading (step 205) the substrate member into an MOCVD chamber. In a specific embodiment, the method supplies one or more carrier gases, step 207, and one or more nitrogen bearing precursor gases, step 209, which are described in more detail below. In one or more embodiments, the crystalline substrate member is provided on a susceptor from the backside to expose the surface region of the substrate member. The susceptor is preferably heated using resistive elements or other suitable techniques. In a specific embodiment, the susceptor is heated (step 211) to a growth temperature ranging from about 700 to about 1200 Degrees Celsius, but can be others. Of course, there can be other variations, modifications, and alternatives.

In a specific embodiment, the present method includes subjecting the surface region of the crystalline substrate to a first flow in a first direction substantially parallel to the surface region. In a specific embodiment, the method forms a first boundary layer within a vicinity of the surface region. In a specific embodiment, the first boundary layer is believed to have a thickness ranging from about 1 millimeters to about 1 centimeters, but can be others. Further details of the present method can be found below.

Depending upon the embodiment, the first flow is preferably derived from one or more precursor gases including at least an ammonia containing species, a Group III species (step 213), and a first carrier gas, and possibly other entities. Ammonia is a Group V precursor according to a specific embodiment. Other Group V precursors include $N_2$. In a specific embodiment, the first carrier gas can include hydrogen gas, nitrogen gas, argon gas, or other inert species, including combinations. In a specific embodiment, the Group III precursors include TMGa, TEGa, TMIn, TMAl, dopants (e.g., Cp2Mg, disilane, silane, diethelyl zinc, iron, manganese, or cobalt containing precursors), and other species. As merely an example, a preferred combination of miscut/offcut/substrate surface configurations, precursors, and carrier gases are provided below.

Non-polar (10-10) GaN substrate surface configured –0.6 degrees and greater or preferably –0.8 degrees and greater (and less than –1.2 degrees) in magnitude toward c-plane (0001);

Carrier Gas: Any mixture of $N_2$ and $H_2$, but preferably all $H_2$;

Group V Precursor: $NH_3$; Group III Precursor: TMGa and/or TEGa and/or TMIn and/or TEIn and/or TMAl; and Optional Dopant Precursor: Disilane, silane, $Cp_2Mg$;

Or

Non-polar GaN substrate with no offcut or miscut;

Carrier Gas: all $N_2$; Group V Precursor: $NH_3$; Group III Precursor: TMGa and/or TEGa and/or TMIn and/or TEIn and/or TMAl; and Optional Dopant Precursor: Disilane, silane, $Cp_2Mg$.

Of course, there can be other variations, modifications, and alternatives.

In a specific embodiment, the present method also includes a step of providing a second flow (e.g., derived from at least a second carrier gas) in a second direction configured to cause change in the first boundary layer to a second boundary layer. In a specific embodiment, the second direction is normal to the first direction, but can be slightly varied according to other embodiments. Additionally, the second boundary layer facilitates improved crystalline growth as compared to formation using the first boundary layer embodiment. In a specific embodiment, the second flow increases a growth rate of crystalline material formed overlying the surface region of the crystalline substrate member. Of course, there can be other variations, modifications, and alternatives.

Depending upon the embodiment, the method also continues (step 215) with epitaxial crystalline material growth, which is substantially smooth and free of hillocks or other imperfections. In a specific embodiment, the method also can cease flow of precursor gases to stop growth and/or perform other steps. In a specific embodiment, the method stops at step 217. In a preferred embodiment, the present method causes formation of a gallium nitride containing crystalline material that has a surface region that is substantially free of hillocks and other defects, which lead to poorer crystal quality and can be detrimental to device performance. In a specific embodiment, at least 90% of the surface area of the crystalline material is free from pyramidal hillock structures. Of course, there can be other variations, modifications, and alternatives.

The above sequence of steps provides methods according to an embodiment of the present invention. As shown, the method uses a combination of steps including a way of forming a film of crystalline material using MOCVD. In preferred embodiments, the present invention includes a multi-flow technique provided at atmospheric pressure for formation of high quality gallium nitride containing crystalline films, which have surface regions substantially smooth and free from hillocks and other defects or imperfections. Many other methods, devices, system are also included. Of course, other alternatives can also be provided where steps are added, one or more steps are removed, or one or more steps are provided in a different sequence without departing from the scope of the claims herein. Additionally, the various methods can be implemented using a computer code or codes in software, firmware, hardware, or any combination of these. In other embodiments, the present MOCVD tool can be modified, updated, varied, or combined with other hardware, processing, and software. Depending upon the embodiment, there can be other variations, modifications, and alternatives.

The above sequence of steps provides a method according to an embodiment of the present invention. In a specific embodiment, the present invention provides a method and resulting crystalline material that is substantially free from hillocks and the like for improved device performance. Other alternatives can also be provided where steps are added, one or more steps are removed, or one or more steps are provided in a different sequence without departing from the scope of the claims herein.

Figure 3:
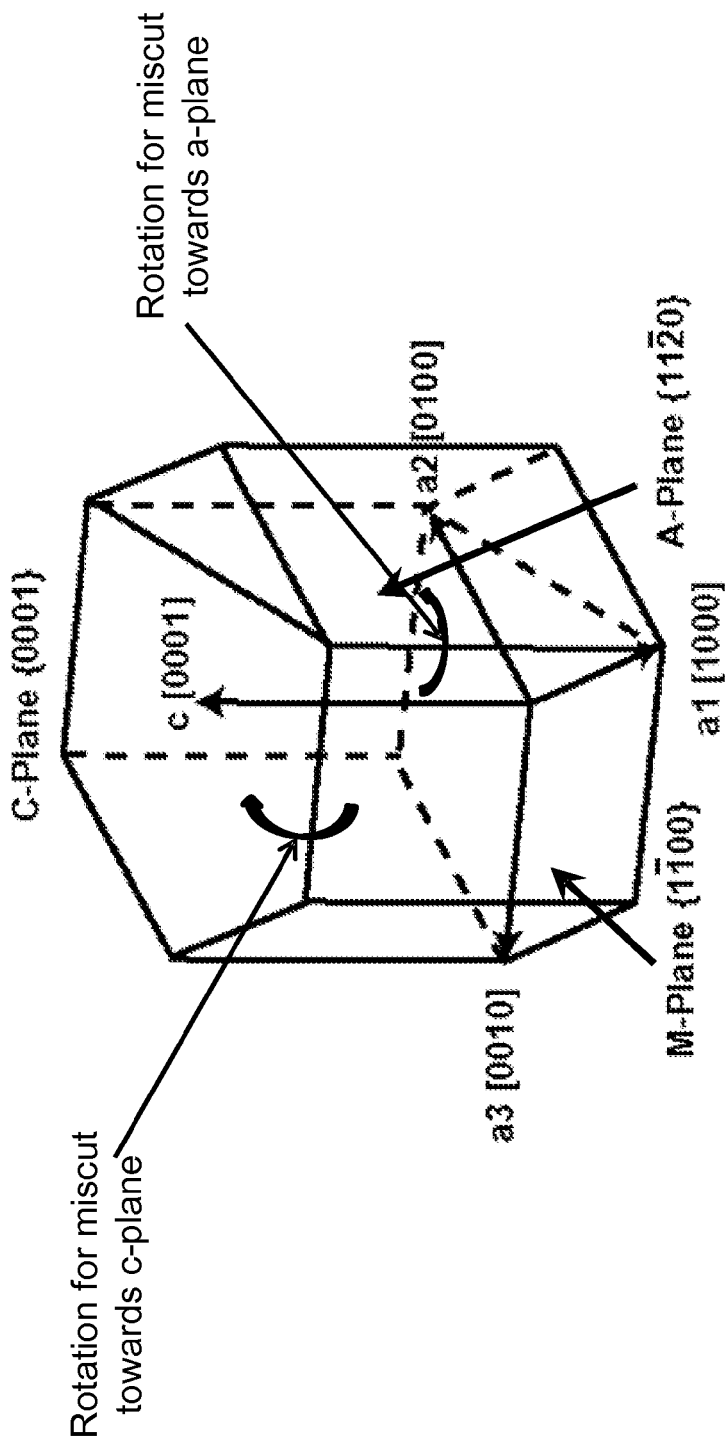
FIG. 3 is a simplified diagram illustrating various miscuts/offcuts in +/−c/a planes according to one or more embodiments of the present invention.

FIG. 3 is a simplified diagram illustrating a wurtzite unit cell structure characterized by a hexagonal shape including various miscuts/offcuts in +/–c/a planes according to one or more embodiments of the present invention. This diagram is merely an example, which should not unduly limit the claims herein. One of ordinary skill in the art would recognize other variations, modifications, and alternatives. As shown, the wurtzite unit cell comprises gallium nitride material, and illustrates relative orientations of the non-polar m-plane and non-polar a-plane. Additionally, the c-plane is also illustrated for reference purposes. In a specific embodiment, the curved arrows illustrate tilt directions for miscut or offcut orientations toward the c-plane and/or a-plane. Of course, there can be other variations, modifications, and alternatives.

EXAMPLE

Figure 4:
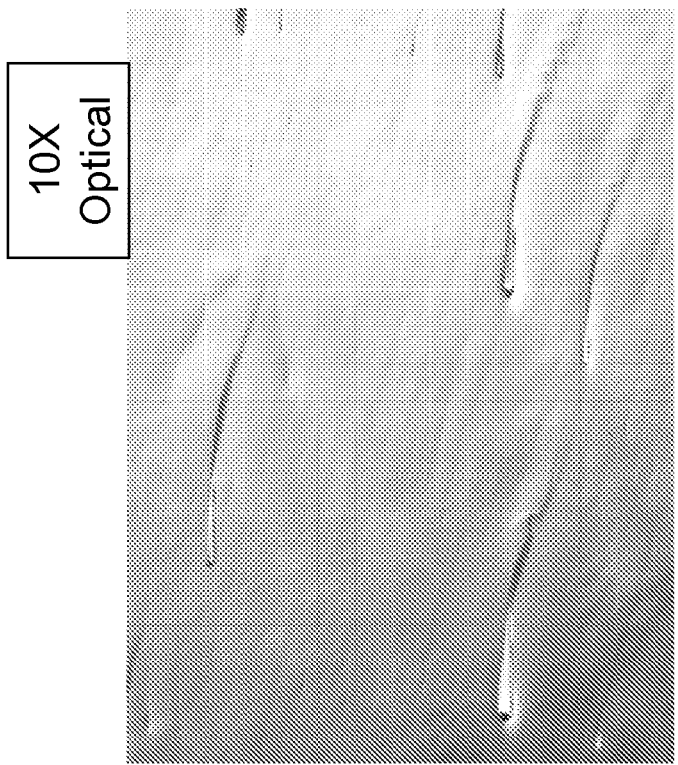
FIGS. 4 through 6 are photographs illustrating the improved GaN film according to an embodiment of the present invention.
Figure 4:
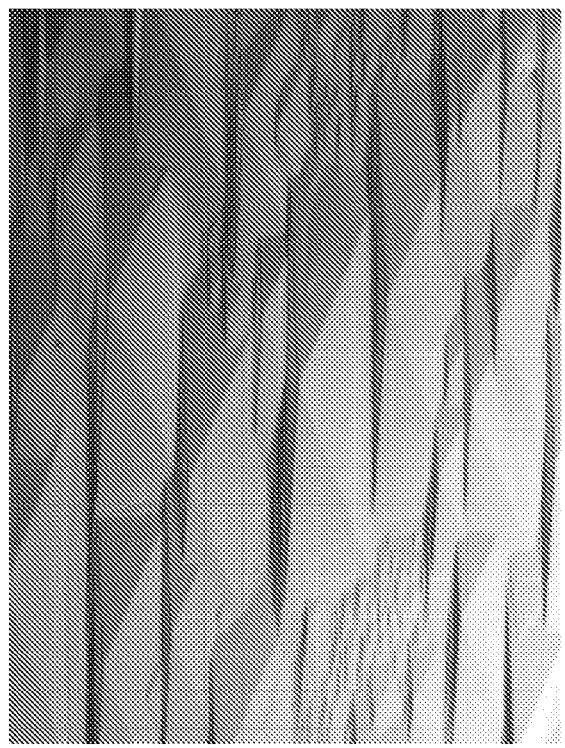
Figure 5:
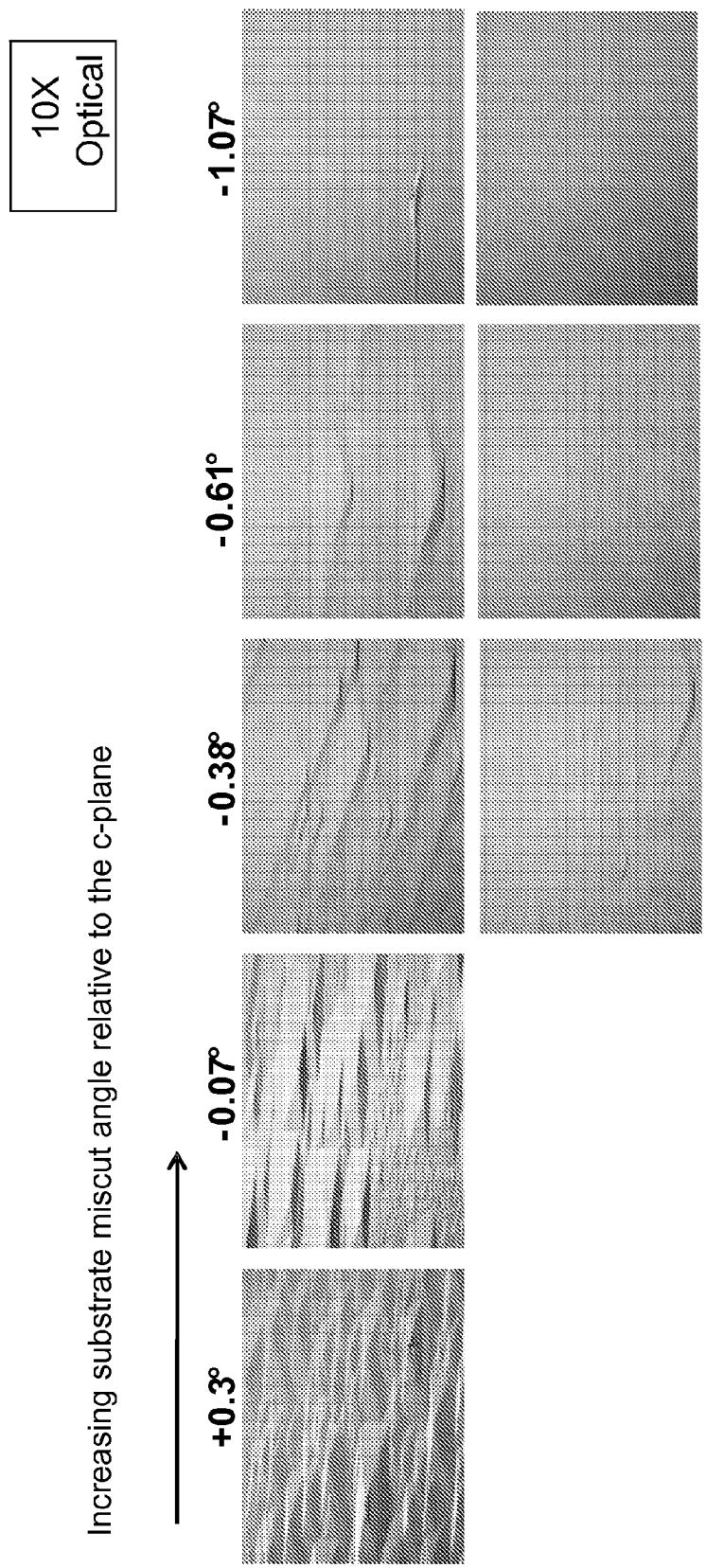
Figure 6:
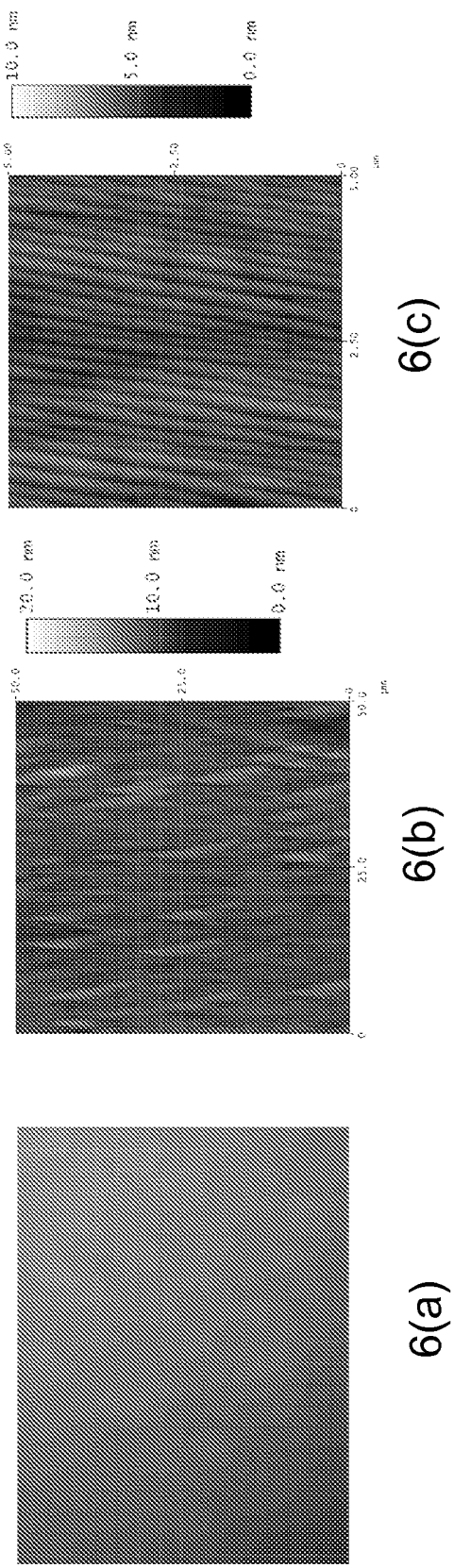

To prove the operation and method of the present invention, we performed various experiments. These experiments are merely examples, which should not unduly limit the scope of the claims herein. One of ordinary skill in the art would recognize other variations, modifications, and alternatives. As an example, FIG. 4 presents optical micrograph images of the resulting surface morphology in epitaxial films grown with the use of $H_2$ carrier gas on (a) an on-axis nonpolar (10-10) GaN substrate and (b) on a nonpolar (10-10) GaN substrate with a substantial miscut towards the a-plane. FIG. 5 presents images of the resulting surface morphology in epitaxial films grown with the use of $H_2$ carrier gas on nonpolar (10-10) GaN substrates with a varying degree of miscut towards the c-plane. FIG. 6 presents images of the resulting surface morphology in epitaxial films grown on a nominally on-axis nonpolar (10-10) GaN substrate with the use of $N_2$ carrier gas. Further details of our experiments are shown below. Of course, there can be other variations, modifications, and alternatives.

In our example, we understood that the hillocking can be controlled with choice of carrier gases ($N_2$ or $H_2$) or a mixture thereof and/or with the choice of slightly off-axis (e.g., miscut or offcut or formation (e.g., grinding, polishing etching, or other shaping processes)) nonpolar (10-10) crystal planes. In particular, the hillocking begins to disappear when the substrate is miscut slightly towards the positive or negative a-plane. See, for example, FIG. 4. For miscuts greater in magnitude than +/−0.3 degrees toward the a-plane, the epitaxial layers became smooth using a carrier gas of $H_2$, which has been known. Unexpectedly, we have discovered a marked double peak in the 400-440 nm in the emission spectra (as measured by photoluminescence and electroluminescence) when the a-plane miscut reaches the required amount to achieve smooth morphology. This could be a useful phenomenon is other devices, but is not desirable for laser fabrication in such wavelength range. It is possible that larger miscuts would eliminate the double peaked spectra and would offer some other benefit. Actually, the double peak is not observed when the composition of the light emitting layer(s) is adjusted for emission in the 480 nm range. These and other limitations have been overcome using the methods and resulting structures claimed and described herein.

In an effort to achieve smooth epitaxial layers with no double peak with an emission spectra around 405 nm, positive and negative miscuts toward the c-plane (0001) were explored using growth techniques with $H_2$ as the carrier gas. See, for example, FIG. 5. It was found that when positive miscut angles (for example)+0.3°, towards the plane c-plane (0001) were used, hillocking was not suppressed and may actually have become more severe. However, when using negative miscut angles towards the c-plane (0001), the hillocking began to disappear when the miscut angle was greater in magnitude than about negative 0.3-0.5 degrees, and would be substantially free from hillocks when the angle was greater in magnitude than about negative 0.6 degrees (or increasing miscut in the negative c direction). There was no double peak observed in the photoluminescence or electroluminescence spectra demonstrating a promising approach to achieving smooth epitaxial layers along with high quality light emitting layers for use in optical devices such as laser diodes and light emitting diodes.

In addition to substrate miscut, choice of MOCVD carrier gas was also explored. It was found that when all $H_2$ is replaced by $N_2$ in the carrier gas, smooth relatively defect free epitaxy could be achieved on nonpolar substrates with nominally non-miscut (0.0+/−0.1 deg) towards the a-plane and c-plane. See, for example, FIG. 6. It is relatively uncommon to use all $N_2$ as the carrier gas when growing p-type GaN due to reduced dopant incorporation in the lattice, which increases resistance of the material and degrades device properties. To date, we have fabricated laser devices demonstrating high performance using all $N_2$ as the carrier gas in the n-cladding, active region, p-cladding, and even p-contact layer. The device did not demonstrate forward voltages higher than those grown using all $H_2$ as the carrier gases. Additionally, we believe that by using the appropriate mixture of $H_2$ and $N_2$ in the carrier gas along with the appropriate negative miscut towards the c-plane, smooth epitaxial layers can be achieved that will exhibit p-type GaN electrical properties equal to those grown in all $H_2$. As shown in 6(a), an optical micrograph image which represents the surface region of a GaN film grown using $N_2$ carrier gas on a nonpolar GaN substrate is provided. The nonpolar GaN substrate has a nominally on-axis (+0.06 towards c-plane and, −0.08 towards a-plane). As shown in 6(a), there are no pyramidal hillocks or other substantial surface morphology features observed. An Atomic Force Microscopy (AFM) height-scale image of a 50×50 micron area of the surface region of the GaN film shown in 6(a) is provided in 6(b) and the surface is substantially smooth. An Atomic Force Microscopy (AFM) height-scale image of a 5×5 micron area of the surface region of the GaN film shown in 6(a) is provided in 6(c). The surface is substantially smooth. Of course, there can be other variations, modifications, and alternatives.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of fabricating an optical device, the method comprising:
   providing a non-polar (10-10) gallium and nitrogen containing substrate member having a off-axis non-polar oriented crystalline surface plane, the off-axis non-polar oriented crystalline surface plane being greater in magnitude than about negative 0.6 degrees toward the c-plane (0001); and
   forming a gallium and nitrogen containing epitaxial layer having a surface region substantially free of hillocks overlying the off-axis non-polar oriented crystalline surface plane.

2. The method of claim 1 wherein the forming comprises using a mixture of hydrogen entities and nitrogen entities as a carrier gas.

3. The method of claim 1 wherein the off axis non-polar oriented crystalline surface plane is greater in magnitude than about negative 0.7 degrees toward (0001).

4. The method of claim 1 wherein the off-axis non-polar oriented crystalline surface plane is greater in magnitude than about negative 0.8 degrees toward (0001).

5. The method of claim 1 wherein the off-axis non-polar oriented crystalline surface plane is greater in magnitude than about negative 0.9 degrees toward (0001).

6. The method of claim 1 wherein the off-axis non-polar oriented crystalline surface plane is greater in magnitude than about negative 1.0 degrees toward (0001).

7. The method of claim 1 wherein the off-axis non-polar oriented crystalline surface plane is greater in magnitude than about negative 1.1 degrees toward (0001).

8. The method of claim 1 wherein the off-axis non-polar oriented crystalline surface plane is greater in magnitude than about negative 1.2 degrees toward (0001).

9. The method of claim 1 further comprising forming an optical device using at least the gallium and nitrogen containing epitaxial layer.

10. A method of fabricating an optical device, the method comprising:
providing a non-polar (10-10) gallium and nitrogen containing substrate member having a off axis non-polar oriented crystalline surface plane, the off-axis non-polar oriented crystalline surface plane ranging from about 0 degrees to a predetermined degree toward either or both the c-plane or a-plane; and
forming a gallium and nitrogen containing epitaxial layer, using at least an atmospheric pressure process, to form a region of a quantum well having a thickness, the gallium and nitrogen containing epitaxial layer having a surface region substantially free from hillocks.

11. The method of claim 10 wherein the forming comprising using a pure nitrogen entity carrier gas.

12. The method of claim 10 further comprising maintaining the non-polar gallium and nitrogen containing substrate member in atmospheric pressure during at least the forming of the gallium and nitrogen containing epitaxial layer.

13. The method of claim 10 wherein the atmospheric pressure ranges from about 700-800 Torr.

14. The method of claim 10 wherein the surface region is substantially free from hillocks ranging from 10-100 microns in dimension.

15. The method of claim 10 wherein the surface region is substantially free from hillocks ranging from 100-200 microns in dimension.

16. The method of claim 10 wherein at least 90% of the area of the surface region is free from hillocks ranging from 10-100 microns in dimension.

17. The method of claim 10 wherein the thickness is at least 3.5 nanometers and greater.

* * * * *